United States Patent [19]

Canestaro et al.

[11] Patent Number: 5,294,259
[45] Date of Patent: Mar. 15, 1994

[54] FLUID TREATMENT DEVICE

[75] Inventors: Michael J. Canestaro, Endicott; Donald G. McBride, Binghamton; Louis J. Konrad, III, Endicott; Ronald J. Moore, Binghamton, all of N.Y.

[73] Assignee: International Business Machines Corporation, Armonk, N.Y.

[21] Appl. No.: 884,818

[22] Filed: May 18, 1992

[51] Int. Cl.$^5$ .............................................. B05C 3/02
[52] U.S. Cl. ................................. 118/411; 134/64 R; 118/410
[58] Field of Search ............... 118/410, 411, 412, 415, 118/428; 134/50, 64 R, 64 P; 68/181 R

[56] References Cited

U.S. PATENT DOCUMENTS

| | | |
|---|---|---|
| 2,381,652 | 7/1941 | Dishauzi . |
| 3,196,832 | 2/1963 | Zin . |
| 3,524,457 | 8/1970 | Laimbock . |
| 4,137,988 | 2/1979 | Croix-Marie . |
| 4,398,818 | 8/1983 | Jeromin et al. . |
| 4,495,024 | 1/1985 | Bok . |
| 4,557,785 | 12/1985 | Ohkuma . |
| 4,564,410 | 1/1986 | Clitheros et al. ............ 118/697 |
| 4,719,173 | 1/1988 | Hahm . |
| 5,007,445 | 4/1991 | Pender . |
| 5,063,951 | 12/1991 | Bard et al. . |

FOREIGN PATENT DOCUMENTS

| | | |
|---|---|---|
| 7910263 | 4/1979 | France . |
| 0131370 | 8/1982 | Japan . |
| 6180826 | 9/1984 | Japan . |

OTHER PUBLICATIONS

IBM Technical Disclosure Bulletin (TDB)vol. 11, No. 11, Apr., 1969, p. 1536, "Multistage Rinse Tank", by Davis.
IBM TDB vol. 12, No. 11, Apr., 1970, pp. 1845-1846, "Cascaded Gravity Feed Manifold", by Gupta et al.
IBM TDB vol. 14, No. 9, Feb., 1972, pp. 2605-2606, "Spray Etch Apparatus", by Antoci et al.
IBM TDB vol. 18, No. 3, Aug., 1975, pp. 690-691, "Cascading Image Developer", by Ludden.
IBM TDB vol. 23, No. 4, Sep., 1980, pp. 1362-1363, "Spray Unit", by Gagne.
Research Disclosure, Sep., 1987, No. 281 (28101), "Constant Pressure Gradient Chemical Process Tank".

Primary Examiner—W. Gary Jones
Assistant Examiner—Brenda Lamb
Attorney, Agent, or Firm—Lawrence R. Fraley

[57] ABSTRACT

A device for applying fluid to a substrate which includes a head member having first and second opposed portions adapted for being fixedly positioned relative to each other. The device is particularly suited for treating a substrate as the substrate moves between the first and second portions. Each portion may in turn include a first channel located at a predetermined distance from the substrate for having a first fluid impinge on the substrate at a first velocity. Additionally, each portion may include a weir adjacent the first channel for having fluid pass thereover at an accelerated rate and thus at a greater velocity than the first fluid, this weir being located at a lesser distance than the first channel. Fluid inlet means is coupled to the respective portions to provide the fluid thereto at desired velocities. Significantly, a fluid blocking means (e.g., an elongated bar) is also included as part of the structure for maintaining the fluids at pre-established levels.

22 Claims, 4 Drawing Sheets

FLUID TREATMENT DEVICE

TECHNICAL FIELD

This invention relates to fluid treatment devices and particularly to such devices for treating substrates or the like as may be utilized, for example, in various information handling system (computer) applications.

BACKGROUND OF THE INVENTION

Various devices designed for the treatment of substrates and similar articles are known in the art, with examples being shown and described in U.S. Pat. No. 2,381,652 (Dishauzi), U.S. Pat. No. 3,196,832 (Zin), U.S. Pat. No. 3,524,457 (Laimbock), U.S. Pat. No. 4,137,988 (Croix-Marie), U.S. Pat. No. 4,495,024 (Bok), U.S. Pat. No. 4,557,785 (Ohkuma), U.S. Pat. No. 5,007,445 (Pender) and, more recently, U.S. Pat. No. 5,063,951 (Bard et al). The devices as shown and described in these patents are capable of providing a variety of different types of treatment for the article (e.g., substrate) being treated, including, for example, coating, cleaning and chemically reacting (etching). Accordingly, by the term treatment as used herein to describe the capability of the invention is meant to include the aforementioned functions (e.g., coating, cleaning and chemically reacting) as well as others (e.g., plating) discernible from the teachings herein. Additionally, by the term fluid as used herein is meant to include both liquids (e.g., etchants, water, etc.) and gases (e.g., air). As will be defined in greater detail hereinbelow, the instant invention is particularly adapted for treatment of substrates which will be utilized as part of the electrical circuit elements in an information handling system (computer) structure, such as an information processor. More particularly, such substrates may form what are referred to in the art as thin film, flexible circuitized substrates for use in various packaging embodiments of such processors. It is to be understood, however, that the invention is not limited to treatment of such substrates in that the invention may be readily utilized for treating several other different types of structures, including those comprised substantially entirely of metal or the like.

As particularly defined herein, the device of the present invention is adaptable for applying various fluids at different velocities and over different periods of time to at least one surface of a substrate located within the device. The invention will utilize at least two fluids (or one fluid, applied more than once) for this purpose, but is readily adaptable, as defined herein, for using several additional fluids, depending on the type of treatment being performed. The invention, as understood, operates in a relatively simple fashion and, additionally, is relatively inexpensive to produce and utilize. Most significantly, the invention as defined herein is readily adaptable for utilization in a mass production environment, to thus benefit from the various advantages thereof.

It is believed that a fluid treatment device possessing the advantageous features described herein and otherwise discernible from the teachings provided below would constitute a significant advancement in the art.

DISCLOSURE OF THE INVENTION

It is, therefore, a primary object of the present invention to enhance the art of fluid treatment devices.

It is another object of the invention to provide a fluid treatment device capable of applying different fluids to a substrate at different velocities and during different time periods so as to perform a desired treatment of the substrate.

It is still another object of the invention to provide such a device which is readily adaptable for treating movable substrates, and, as defined, for also accommodating for various movements (e.g., lateral) of the substrate during passage through the invention.

It is yet another object of the invention to provide a method of treating a moving substrate through the application of first and second quantities of fluids onto the substrate, each quantity at a specified velocity and for a predetermined time period.

In accordance with one aspect of the invention, there is defined a device for applying fluid to a substrate wherein the device comprises a head member including first and second portions adapted for being fixedly positioned relative to each other such that a substrate may pass therebetween, at least the first portion of the head member including a first channel therein and adapted for having a quantity of fluid therein for engaging the substrate while moving at a first velocity, the first portion further including a weir adapted for having a volume of fluid pass thereover such that this fluid engages the substrate while moving at a second velocity greater than the velocity of the fluid within the described first channel, fluid inlet means operatively connected to the first channel and the weir for supplying the quantity of fluid to the first channel and the volume of fluid to the weir at a predetermined pressure sufficient to cause the fluids to move at the described velocities, and fluid blocking means located adjacent the first channel and the weir for blocking the quantity of fluid and the volume of fluid to thereby maintain these fluids at established levels within the head member's first portion such that these fluids will engage the substrate's surface while moving at the described velocities.

In accordance with another aspect of the invention, there is defined a method of treating a substrate which includes first and second materials as part thereof, the method comprising the steps of applying a first quantity of fluid to a surface of a first of the materials of the substrate while the fluid moves at a first velocity and for a first predetermined time period so as to, significantly, modify at least one of the first material's physical properties (e.g., hardness), and thereafter applying a second quantity of fluid to the first material while the second quantity moves at a second velocity greater than the first and for a second time period less than the first time period so as to substantially remove the modified, first material from the moving substrate.

BEST MODE FOR CARRYING OUT THE INVENTION

For a better understanding of the present invention, together with other and further objects, advantages and capabilities thereof, reference is made to the following disclosure and appended claims in connection with the above described drawings.

Figure 1:
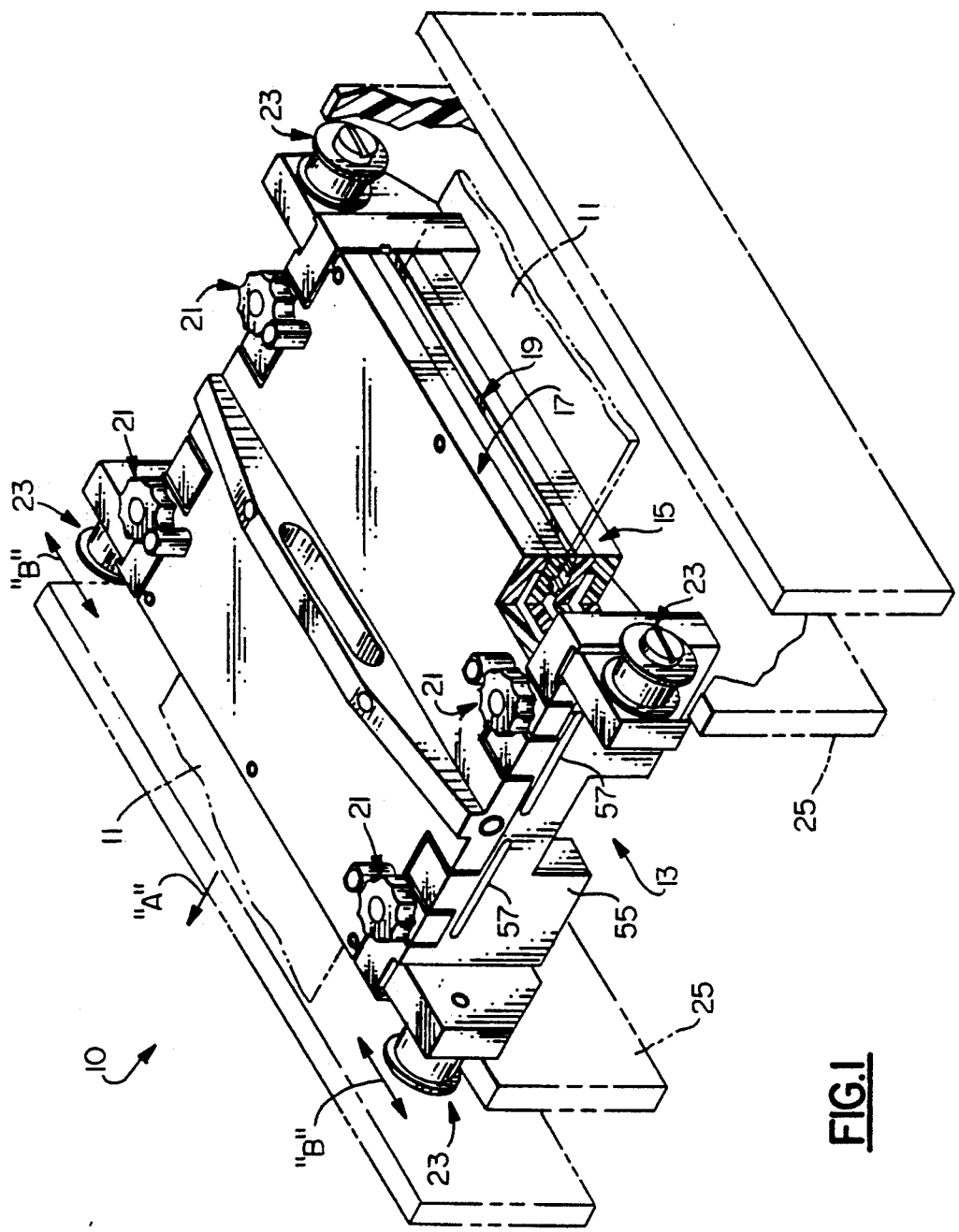
FIG. 1 is a perspective view of a fluid treatment device in accordance with one embodiment of the invention.

In FIG. 1, there is shown a device 10 for applying fluid to a substrate 11 (shown in phantom) as the substrate moves therethrough. It will be understood from the following, however, that the invention is also adaptable for applying fluid to a stationery substrate with the device moving relative thereto or, alternatively, with both substrate and head member stationery or moving. Accordingly, the invention is not limited to fluid treatment of moving substrates.

Device 10 includes a head member 13 which includes first and second portions 15 and 17, respectively. In the view of FIG. 1, first portion 15 is understood to be the lower of the two, while the upper, second portion 17 is located thereover. First and second portions 15 and 17 are designed for being fixedly positioned relative to each other so as to define a fixed opening 19 therebetween. As seen in FIG. 1, substrate 11 moves through this opening for eventual treatment by device 10. Fixing the relative position of these two portions can be accomplished in several ways, a preferred being the use of adjustment knobs 21 which screw onto threaded posts (not shown) which project from the lower first portion 15. Other means are of course readily possible and the invention is not limited to this particular arrangement.

Figure 3:
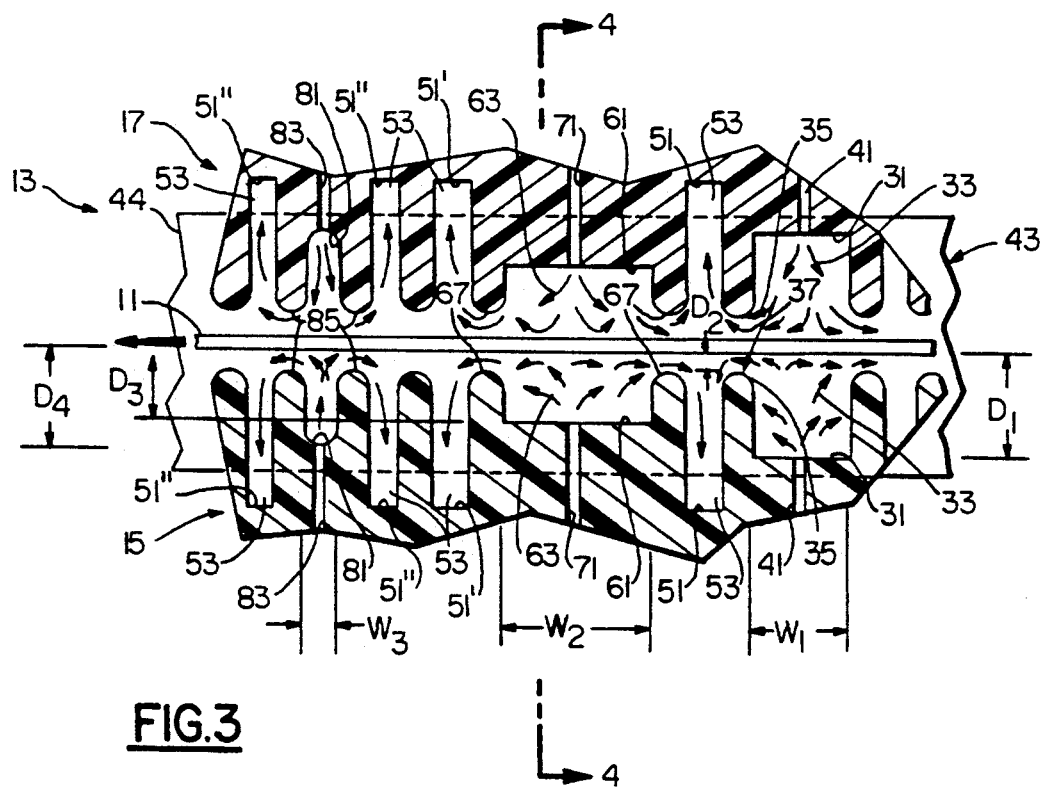
FIG. 3 is a partial side elevational view, in section and on an enlarged scale over the views in FIGS. 1 and 2, illustrating the first and second portions of the invention's head member, and particularly the various configurations of certain parts thereof.

Significantly, first and second portions 15 and 17 are fixedly positioned relative to each other 17 are fixedly positioned relative to each other such that substrate 11, when moving therethrough, will be spacedly positioned from these opposing portions. This embodiment is best seen in FIG. 3 and will be further defined hereinbelow. Various means may be employed for moving substrate 11, including rollers or the like (not shown) located adjacent and thus relative to device 10. Such rollers are not part of device 10 as described herein, but it is understood that relative minor modification may be made to the device to incorporate these elements, if desired. Significantly, device 10 is adapted for accommodating for longitudinal movement of substrate 11 as the substrate moves in the direction indicated ("A" in FIG. 1). Should substrate 11 fluctuate laterally during such movement, device 10 is uniquely capable of accommodating such lateral movement to thus assure the most effective treatment of substrate 10. Such movement for device 11 is possible utilizing a plurality of rollers 23 located at the corners of the device in the manner shown. These rollers are adapted for movement on a pair of parallel rails 25 (phantom) in opposing lateral directions ("B" in FIG. 1). Directions "B" are understood to be substantially perpendicular to the longitudinal direction of movement ("A") of substrate 11. This feature is deemed particularly advantageous when treating substrates of extended length, and particularly when such substrates are moved over rollers or the like during such treatment.

In FIG. 3, there is shown an enlarged partial view, in section, of the first and second portions 15 and 17 of head member 13. It is understood that FIG. 3 only represents a portion of the overall length of these important parts of head member 13 and thus attention is also directed to FIG. 2, which illustrates device 10 with the upper, second portion 17 removed. Significantly, each portion 15 and 17, if treating opposed surfaces of interim substrate 11, includes a first channel 31 therein located at a first, established distance ("D1") from the respective surface of substrate 11 adjacent thereto. Significantly, first channel 31 is designed for having a quantity of fluid 33 (represented by the several smaller arrows in FIG. 3) therein for engaging the adjacent surface of substrate 11 while this fluid moves at a first velocity. Of further significance, the respective portion 15 or 17 further includes a weir 35 therein located at a second, established distance ("D2") from the adjacent, respective surface of substrate 11 and adapted for having a volume of fluid 37 (represented by smaller arrows) pass thereover. By the term weir as used herein is meant to define a structure designed to engage fluid to cause said fluid to reach a predetermined level whereupon said fluid will pass thereover. Although the weirs as depicted herein are shown to include curved external surfaces (at the terminal ends thereof), it is understood that the invention is not limited to such configurations as others (e.g., flat) may be used. Significantly, weir 35 is located at the described second distance ("D2") such that the volume of fluid 37 passing thereover will be moving at a greater velocity than that of the fluid 33 within first channel 31. (It is to be understood that device 10 is not limited to first and second portions of the device's head member being identical.) That is, in the broader aspects of the invention, it is only necessary that one of these portions include the channel and weir elements (and others) as defined herein, as the invention is readily capable of providing fluid treatment to only one surface of a substrate passing therethrough.) In one embodiment of the invention, first channels 31 were located at a distance of about 0.250 inch to about 0.500 inch from the respective substrate surface while the adjacent surfaces of the weirs 35 were located at a distance of only about 0.001 to about 0.010 inch. The aforementioned distances between the substrate and channel and weir portions of the invention may be adjusted, depending on the processes to be performed. The invention is thus not limited to the specific distances, or ratios therebetween, as cited above or elsewhere herein.

A substrate comprised of both a polymer material (e.g., polyimide) and a metal (e.g., copper) thereon was treated. A preferred fluid for treating this material (for the purpose defined hereinbelow) was potassium hydroxide, this material applied at a velocity of about 200 feet per minute through holes 41 which access first channels 31. Holes 41 represent part of the invention's inlet means and are in turn operatively coupled to a suitable source (not shown) containing the desired fluid (in this case, as stated, potassium hydroxide). At such velocities, and using such fluid, substrate 11 moved at a uniform rate with the range of from about 0.50 feet per minute (f.p.m.) to about ten f.p.m. Additionally, first channels 31 may each include a width (W1 in FIG. 3) ranging from about 0.10 inch to as great as 6.00 inches. Accordingly, the substrate 11 is exposed to fluid 33 while moving at the defined first velocity within channel 31 for a period of time of from about ten seconds to about thirty seconds. The substrate as so exposed is then subjected to the higher velocity fluid 37 passing between weir 35 and the respective substrate surface for a period of time of from only about one second to about two seconds. Such exposure to fluid 33 in effect enables the substrate material to be "soaked" for the purposes defined hereinbelow. Exposure to this soaked material at the higher velocity, more rapidly moving fluid over the respective weirs 35 in turn may serve to loosen or otherwise affect the soaked material in a desired manner.

In order to attain the desired fluid velocities defined herein, it is understood that these fluids (or singular fluid, if applied in two different quantities at the described two locations, e.g., at the first channel and weir) must be supplied to the invention's head member at a predetermined pressure. Using the fluids, substrates, structural configurations and distances mentioned herein, these fluids were supplied at a pressure within the range of from about less than one pound per square inch (p.s.i.) to about sixty p.s.i. Pressures as low as about 0.10 p.s.i. have been successfully used. Such pressure is preferably constant for each application, and may be adjusted as necessary. Such fluids, understandably, are provided using the invention's inlet means, described in greater detail hereinbelow.

Figure 2:
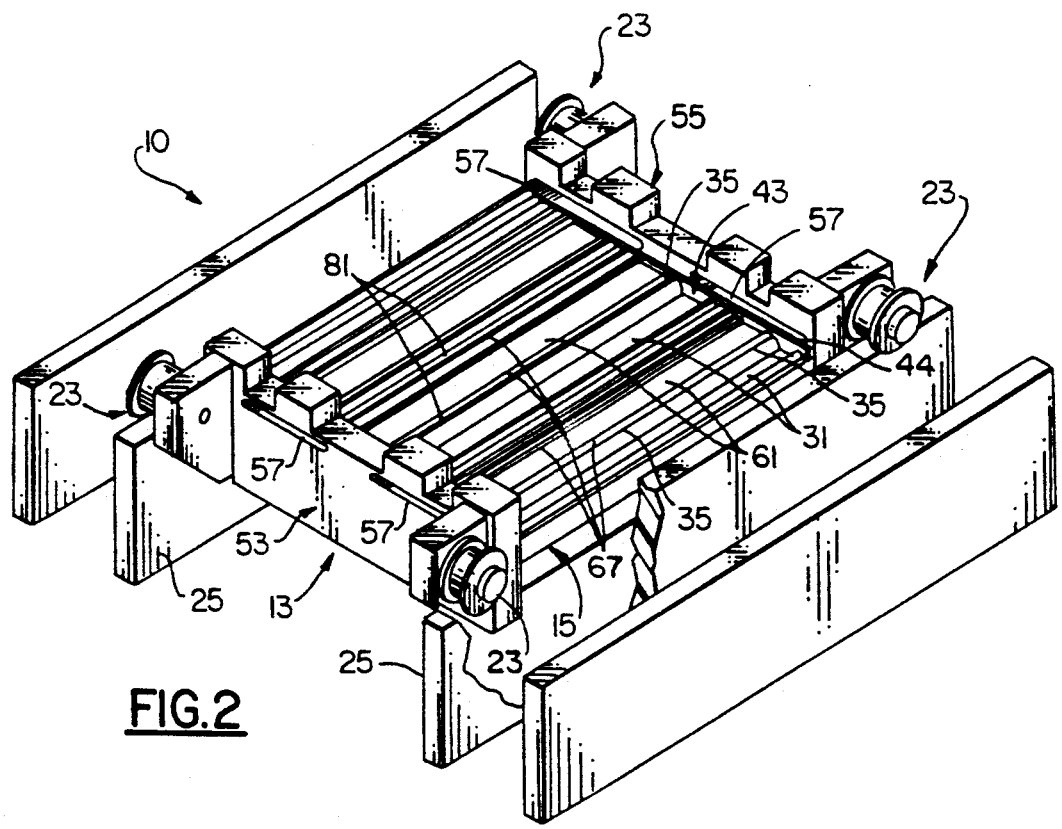
FIG. 2 is a perspective view of the fluid treatment device of FIG. 1, having the upper (or second) portion of the device's head member removed (for illustration purposes)
Figure 4:
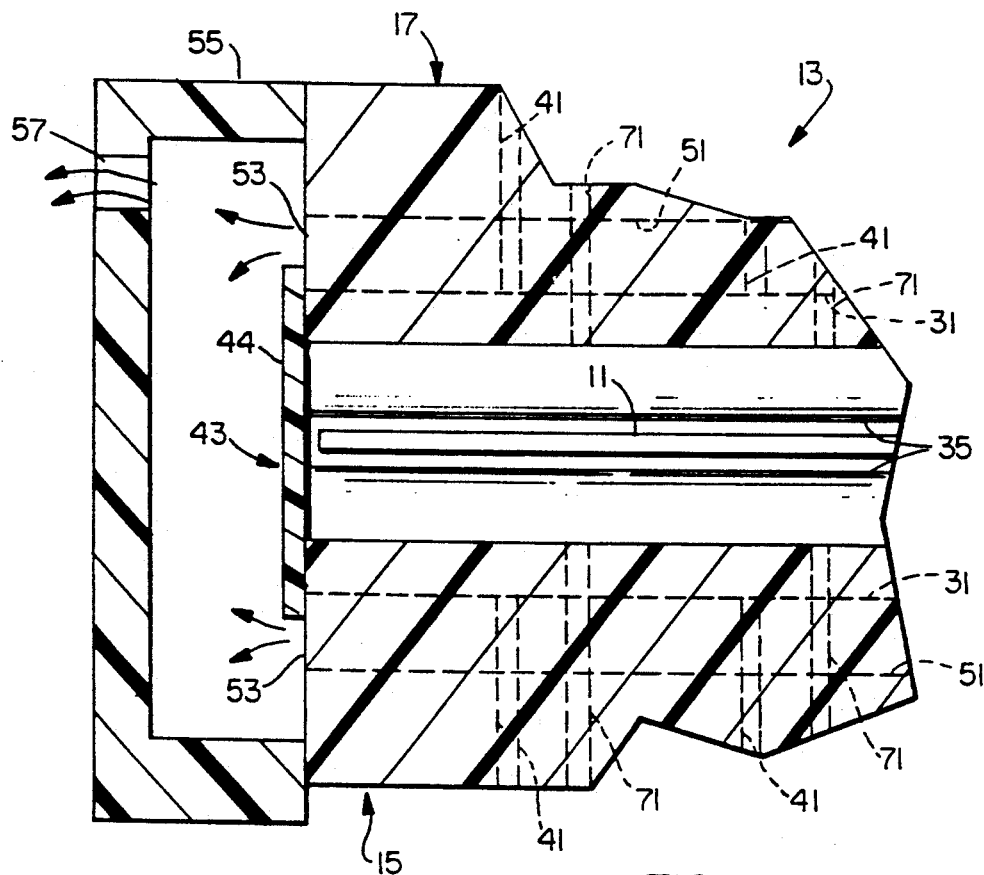
FIG. 4 is a partial front elevational view, in section, of the head member as shown in FIG. 3, as taken along the line 4—4 in FIG. 3 and on a much enlarged scale over the view in FIG. 3.

In order to assure the desired velocities for the fluid when treating substrate 11 in the manner shown in FIG. 3, device 10 further includes fluid blocking means 43 in the form of an elongated bar 44 located along one of the longitudinal sides of both head members 15 and 17. Blocking means 43 is also seen in FIGS. 2 and 4 in this position. Significantly, the elongated bar 44 of blocking means 43 substantially prevents fluid from escaping in the lateral direction of the elongated channels 31 which form the respective portions of head member 13. These elongated channels 31 and adjacent weirs 35 are best seen in FIG. 2, for the lower first portion 15. Clearly, fluid which is passed into the respective first channels 31 (e.g., through holes 41) will seek to escape in the lateral direction. Such escape is substantially prevented using the relatively flat, elongated bar 44 such that this fluid must now pass over the adjacent weirs 35. Respective positioning of the first channels 31 and weirs 35 in comparison to the overall width of bar 44 is best seen in the cross-sectional view of FIG. 4. Understandably, blocking means 43 thus maintains the respective fluids within head member 13 at established levels (as shown) such that these fluids will engage substrate 11 at the velocities defined herein. This is deemed to constitute a significant aspect of the invention in that it assures fluid application at precise velocities onto the surface(s) of a spacedly positioned substrate such that desired treatment thereof can occur. Such fluids are, understandably, provided to device 10 from the respective source (e.g., tank) which will preferably also include an appropriate supply means (e.g., pump) for assuring fluid supply to device 10 at the desired, predetermined pressure. Such a source and supply means are well known in the art and further description is not believed necessary.

As seen in FIGS. 3 and 4, portions 15 and 17 each further include outlet means in the form of at least one drain channel 51 located adjacent weirs 35 and adapted for having the volume of fluid which passes over the weirs enter therein, whereupon this fluid will escape outwardly through openings 53 located at the end of the elongated drain. Preferably, openings 53 are provided in both opposed ends of each drain. Significantly, these openings 53 are defined by the walls of drain 51 and elongated bar 44. The fluid which is applied to substrate 11 passes through these drains and outwardly into respective manifolds 55 (FIG. 4), located along the lateral sides of device 10. See also FIG. 1. Manifolds 55 may form an integral part of the adjacent first and second portions 15 and 17 or, alternatively, may represent separate structures attached thereto. Significantly, fluid escaping through the invention's drains and entering these respective manifolds (as shown in FIG. 4) is accumulated therein to a pre-established level which, significantly, includes at least one (and preferably several) aperture 57 which in turn is located at an uppermost portion of the manifold and thus substantially above the highest level attained by the quantity and volume of fluids defined hereinabove as said fluids are located within first channel 31 and above weirs 35, respectively. This positioning of outlet aperture(s) 57 for these fluids represents a significant aspect of the invention in that it further serves to assure that the fluids designed for being applied onto substrate 11 will be so applied at the respective velocities defined herein.

The rate of fluid escape (via drains 51) may be adjusted by increasing the size of openings 53, such as, for example, by providing drains of greater depth than shown, and using the same size blocking bar. Alternatively, the overall width of the bar can be reduced, using the same depth drains. Other modifications are also possible.

As shown in FIG. 2, device 10 includes two manifolds 55, each located on the opposed sides of first portions 15 and 17. These manifolds, as well as the invention's elongated fluid blocking means 43, are thus located substantially parallel to the direction of travel ("A") of substrate 11. These are thus also located substantially perpendicular to the elongated channel and weir elements defined above. Such positioning relationships are not deemed to limit the invention, however, in that other orientations may be successfully utilized. As shown in FIGS. 1 and 2, each manifold 55 preferably includes a pair of elongated slots which constitute the respective apertures 57. This also is not meant to limit the invention in that other configurations for these apertures, as well as a greater number thereof, are readily possible. Preferably, the invention's outlet means (e.g., manifolds 55) are operatively coupled to a suitable collection reservoir (not shown). Further, should recirculation of these fluids be desired, this collection reservoir may in turn be coupled to the described source (e.g., tank) and supplied thereto in a recirculatory manner. Appropriate filtration means (not shown) may also be included within this system, if desired. Such additional structure are well understood in the art and further description is thus not believed necessary.

As shown in FIGS. 2-4, portions 15 and 17 may further include a second channel 61 therein established at a third distance ("D3") from the respective, adjacent substrate surface. Such an arrangement enables another fluid 63 to be applied to substrate 11, while moving at a different velocity than that previously defined. Alternatively, it is also possible to apply the same fluids as previously applied, should repetition be desired. In one embodiment, as defined above, one example of this second fluid may comprise water or the like for the purpose of rinsing the substrate. Second channel 61 is located at a distance less than that of first channel 31 and thus is designed particularly for applying fluid 63 to substrate 11 at a slightly greater velocity than that for the first channel. In one embodiment of the invention, this fluid 63 was applied while moving at a velocity of about one f.p.m., with channel 61 being located at a distance of about 0.250 inch from the respective substrate surface. Still further, each channel 61 may preferably include a weir 67 along opposing sides thereof for having fluid 63 pass thereover, and thus at an accelerated rate (greater velocity) than that within the respective second channel. Fluid 63 is preferably provided to the respective second channels through a plurality of holes 71. As shown in FIG. 4, each of the channels 31 and 61 include a plurality of holes (41 and 71, respectively) spacedly located therein.

In one embodiment of the invention, as described above, second channels 61 each possess an overall width ("W2") of about one inch. Significantly, fluid passing from these channels and applied to substrate 11 is allowed to escape from the respective portions 15 and 17 through orifices 53 located at the respective opposing ends of adjacent drain channels 51 and 51', which orifices are defined by the respective drain channels and corresponding elongated bar of the invention's fluid blocking means. Thus, it is seen that the invention's fluid blocking means also functions in this portion of the invention to maintain the fluid 63 at the desired accelerated rates of flow necessary to accomplish the desired results.

It is thus seen that the arrangement depicted herein provides for the use of, possibly, two different fluids from the respective channels 31 and 61 without mixing thereof, said fluids being removed from the invention, in one instance, through a common drain channel. It is also within the scope of the invention to provide a separate additional drain channel for the fluid passing over the weirs 67 nearest the respective first channels such that these fluids will only exit into their own drain channel such that fluid mixing is totally eliminated. Such prevention of mixing will of course further necessitate appropriate segmenting of the adjacent manifolds such that these escaping fluids exit into separated receiving chambers (not shown) therein, each chamber having its individual, separate exit aperture 57. Such modification to the invention is well within the scope of those skilled in the art and further definition is not believed necessary.

As seen in FIG. 3, each portion 15 and 17 may further include a third channel 81 therein for applying fluid to substrate 11 after the substrate has passed through the aforementioned prior application locations. Third channels 81 may in turn be of a width ("W3") substantially less than the defined widths of channels 31 and 61. Third channels 81 may also be located at a different distance than the first and second channels 31 and 61. Accordingly, these third channels may in turn apply fluid moving at a different velocity than that of the preceding two channels in order to thus uniquely treat the substrate in yet another manner. One example of a fluid which may be applied from third channels 81 is sulfuric acid, which fluid may be applied while moving at a velocity of from about 0.50 f.p.m. to about one f.p.m. This third channel may also be at a distance ("D4") of about 0.125 inch. In such an arrangement as depicted herein, these third channels may possess a width of about two inches. Each channel 81 is supplied fluid through holes 83 therein which holes in turn are operatively coupled to a suitable fluid supply means in a manner similar to that for the other channels defined herein. Fluid passing from channels 81 may preferably pass over weirs 85 located along opposing, adjacent sides thereof and into respective, adjacent drains 51" and out through respective orifices 53, which orifices in turn are defined by the respective drain walls and fluid blocking bar 44 similarly to the escape orifices for the preceding elements of the invention. Should separation of this fluid from the others be desired, appropriate individual chambers may be provided within the respective manifolds 55 in a manner similar to that defined above. Additionally, each chamber would contain its own escape apertures, whereupon the fluid may be returned to a separate collection reservoir (and recirculation) if desired.

Figure 5:
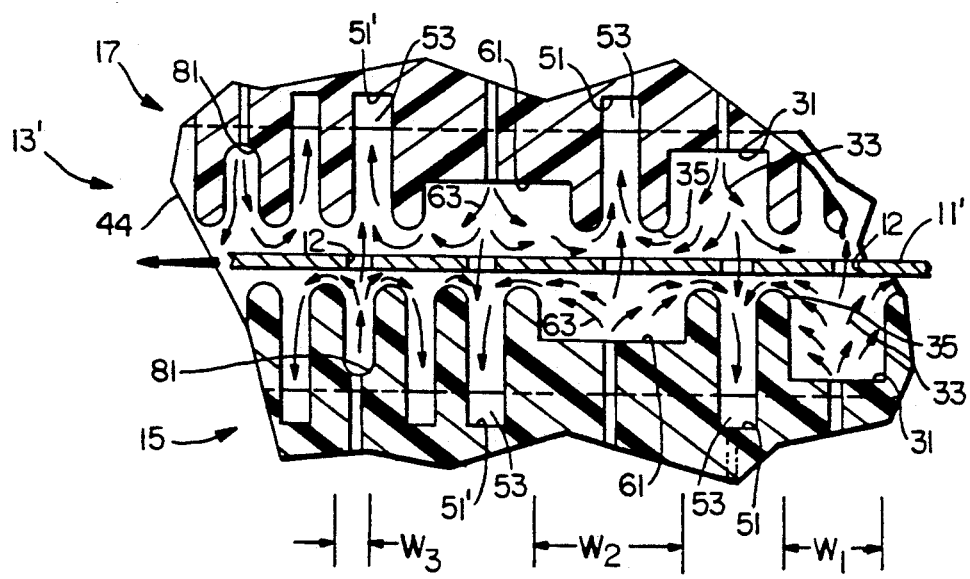
FIG. 5 is a side elevational view, in section, of the head member of the invention in accordance with an alternate embodiment thereof.

In FIG. 5, there is shown another embodiment of a head member 13' which may be utilized as part of device 10. Head member 13' differs from head member 13 in FIG. 3 as a result of offsetting of the opposing first and second portions 15 and 17. As shown, each portion is slightly offset such that the respective drain channels of one portion are located substantially opposite the inlet channels of the opposing, other portion, and vice versa. This arrangement is particularly suitable when treating substrates 11' containing pluralities of openings 12 therein. As seen in FIG. 3, fluids applied from one side of the substrate (and thus from one of the portions 15 or 17) are able to pass through these openings 12 in a facile manner, by virtue of the offset relationship. This arrangement, combined with the other unique aspects of the invention, thus assures effective treatment of apertured substrates, such as those which form the initial components (e.g., copper sheet) of flexible circuitized substrates used in computer processors. Such relatively thin components, defined further hereinbelow, may include undesirable materials or the like within these openings and removal thereof thus highly desired. The embodiment of FIG. 5 is particularly adapted for such treatment.

Figure 6:
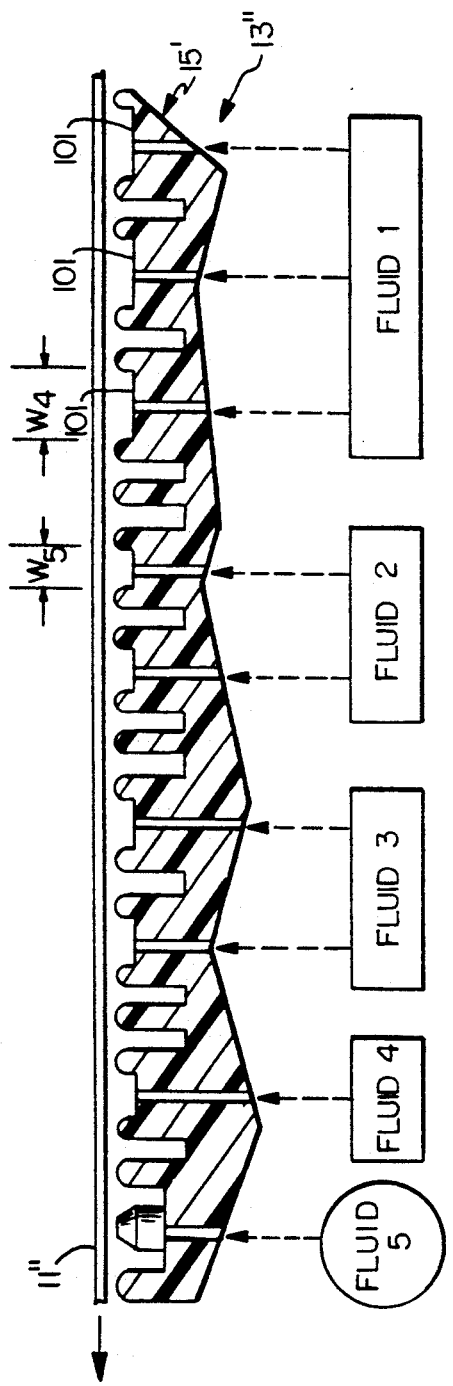
FIG. 6 is a side elevational view of one of the portions of the invention's head member, illustrating one of the various methods of treatment which the invention is capable of performing.

In FIG. 6, there is illustrated a combination of various fluid channels (and drains) which may form one embodiment of the invention's head member (13") for particularly treating a substrate 11" as this substrate moves thereover. It is understood that the invention depicted in FIG. 6 is adapted for possible use with another, similar portion for the head member on the exact, opposite side of the substrate or, alternatively, at a slightly offset orientation (as depicted in FIG. 5), if desired. Accordingly, a description of only one portion (15') for such a head member 13" is deemed necessary. The assembly in FIG. 6 is particularly adapted for treating a moving substrate 11" which includes a first part 91 of metal (e.g., copper) having a second material 93 located on opposing surfaces thereof. Such a substrate 11" is shown, partially and in section, in FIG. 7. It is understood that the invention of FIG. 6 is not limited solely to treatment of the type of substrate defined in FIG. 7, however, in that other substrates may be readily treated by this assembly. Accordingly, the assembly of FIG. 6 is cited to illustrate one example of the various modifications possible using the present invention so as to accomplish a desired treatment of a particular substrate. The substrate and assembly described in FIGS. 6 and 7 is thus meant for illustration purposes only of the unique features of the present invention.

Figure 7:
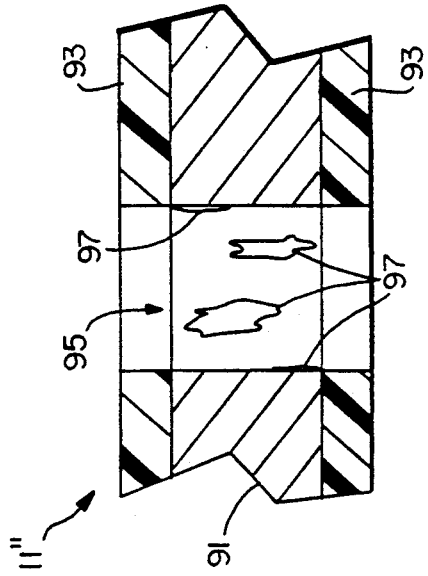
FIG. 7 is a partial, elevational view, in section and on a much enlarged scale, illustrating one of the substrates which are capable of being treated in accordance with the teachings of the present invention.

Substrate 11", as shown in FIG. 7, includes first metal material 91 having the second material 93 on opposing surfaces thereof. Should substrate 11" eventually be utilized as a thin film, flexible circuitized element of the type described herein, one example of a second material 93 is polyimide, a known dielectric. Such material is appropriately cured to form the dielectric portion of the resulting circuitized substrate. This material, several types of which are known in the industry, is preferably applied to the metal base element 91 in a technique (e.g., lamination) known in the art, and further description is not believed necessary. During the formation of such substrates, it is common to provide (e.g., drill) several apertures 95 therein, which apertures in the final structure may include suitable plating, (e.g., copper) or the like which in turn may serve as a means for electrically coupling opposed circuit (e.g., signal or ground) planes in the final structure. Such openings 95 may also be referred to in the art as plated through holes, which are known in the art, and further description is not believed necessary. During this hole formation, various portions of the dielectric material 93 may extend within the opening 95 (e.g., as a result of drilling or the like to provide these openings). Such undesirable portions of material 93 are depicted by the numeral 97 in FIG. 7.

Substrate 11" may possess other configurations than that depicted in FIG. 7. For example, the dielectric (e.g., polyimide) may form the interim layer with opposed metal (e.g., copper or chrome-copper-chrome) layers thereon. Further, only a single dielectric and adjacent conductive layer is possible.

It is understood that the assembly of FIG. 6 is particularly designed for removing these undesirable materials from the respective openings 95 such that the substrate 11", as so treated, may then be eventually further treated (e.g., including addition of the aforementioned plating) to provide a high quality end product.

In FIG. 6, substrate 11", containing openings 95 therein (not shown in FIG. 6) is moved at a uniform rate of from about three f.p.m. to about ten f.p.m. across portion 15'. Portion 15' in turn includes at least two first channels 101 for having a first fluid (FLUID 1) pass therein for application to the substrate. This first fluid, in one example of the invention, is preferably potassium hydroxide, as stated above. This first fluid is removed from portion 15' in accordance with the teachings hereinabove. Following this fluid application, preferably for a time period of about one minute, substrate 11" is then exposed to a second fluid (FLUID 2), one such example of this second fluid being water, the purpose being to substantially rinse the substrate. The first fluid, being potassium hydroxide, serves to attack the portions of the substrate's polyimide material located within the substrate's openings (and others, if desired) to effectively cause swelling (and softening) thereof such that the application of the second fluid, at a higher velocity, will serve to remove these undesirable portions from the respective apertures. The increased velocity of fluid over the invention's weirs further assists in loosening of the swelled portions of the polyimide, e.g., by preventing such swelled portions from thickening, as would occur in the absence of such fluid impingement. Following removal of the swollen material, the substrate 11" may then be exposed to yet a third fluid (FLUID 3), one example being sulfuric acid, the purpose of which is to substantially neutralize the potassium hydroxide. This third fluid may be applied at a velocity of about one f.p.m., in comparison to the velocity of the first and second fluids (one f.p.m. and 100 f.p.m. respectively). At the uniform rate of travel defined, substrate 11" is thus preferably exposed to the first fluid for a time period of about one minute, then exposed to the second, rinsing fluid for a period of about 0.50 minutes, and then exposed to a neutralizing sulfuric acid for a period of about one minute, at the fluid velocities cited above. After this three-fluid treatment, substrate 11" is then exposed to a fourth fluid (FLUID 4), which in one embodiment may be water, the purpose being to remove any acid material remaining on the substrate. Following these four fluid applications, the substrate may be dried with a fifth fluid, which in a preferred embodiment of the invention, is air. Accordingly, the portions of the invention's head members are sufficiently adaptable so as to further include such gas application, if desired.

It is thus seen in FIG. 6, that various fluid channels and adjacent weirs may be utilized in a combination of ways in order to perform a variety of treatments for a desired substrate. In the above embodiment, the respective widths for each of the channels for the first fluid ("W4") were about six inches (a total of four being used), while those for the second fluid ("W5") were about 0.250 inch each (a total of eight being used). The additional channels for FLUID 3 and FLUID 4 were each about 0.50 inch and 0.25 inch in width, respectively (a total of four and eight, respectively, being used). It is also seen in FIG. 6 that each of the fluid channels is separated by an interim drain channel such that fluid separation is achieved. Each channel also includes weirs on opposite sides thereof for passing fluid thereover so that said fluid impinges on the substrate at a greater velocity than that in the respective channel. In the embodiment depicted in FIG. 6, the fluid velocity at the adjacent weirs represented an increase of about 100 percent over the velocity in the respective, fluid channel located adjacent thereto.

The method as obtained using the assembly in FIG. 6 thus provides for fluid application to a substrate such that at least one of the physical properties (e.g., hardness) of at least a portion of this substrate's first material is modified whereupon a second fluid is applied (at a second velocity equal to or greater than that of the first fluid and for a less time period than the first) so as to effectively remove these modified portions of the first material therefrom. As mentioned, such modification of the substrate's first material results in swelling thereof prior to such removal. Accordingly, this material is "soaked" for the defined predetermined time period in order that such effective removal may be subsequently accomplished.

Thus there has been shown and described a device for applying fluid to a substrate wherein the device is able to treat either only one surface of the substrate or, in an alternative embodiment, both opposing surfaces thereof. Uniquely, the device is able to provide fluids at different flow rates in order to accomplish desired objectives, such as partial material removal. Such a device may also accomplish several additional functions, including rinsing, coating, etc., if desired. The invention is thus not limited to particular treatment of a substrate in the manner taught herein.

It is understood that when defining a head member wherein both opposing portions are used (e.g., either directly opposite each other or as staggered in FIG. 5)

that the counterpart elements (e.g., the first channel 31 in portion 17 relative to first channel 31 in portion 15) may be at distances from the interim substrate substantially the same as the counterpart. For example, the first channel in portion 17 would be at a distance substantially the same as the counterpart first channel in portion 15. Thus, if portion 15 includes a first channel, weir and second channel at first, second and third distances, this counterpart first channel in part 17 would be at a fourth distance which may be substantially the same as the first distance. Similarly, the second portion's weir and second channel would be at fifth and sixth distances respectively.

The head members and adjacent manifolds of the invention may be comprised of plastic (e.g., PVC, CPVC, polycarbonate) or metal (e.g., titanium), depending on the fluids used. Preferably, a metal is used for aggressive etching operations. The other portions of the invention (e.g., rollers 23) as shown, e.g., in FIG. 1, are preferably titanium or the like material.

While there have been shown and described what are at present considered the preferred embodiments of the invention, it will be understood to those skilled in the art that various changes and modifications may be made therein without departing from the scope of the invention as defined by the appended claims.

What is claimed is:

1. A device for applying fluid to a substrate, said device comprising:

a head member including first and second portions adapted for being fixedly positioned relative to each other and defining an opening therebetween adapted for having a substrate positioned therein, at least said first portion of said head member including a first channel therein located at a first, established distance from said substrate when said substrate is positioned within said opening and adapted for having a quantity of fluid therein for engaging a first surface of said substrate as said quantity moves at a first velocity, said first portion further including a weir therein located at a second, established distance from said substrate less than said first distance when said substrate is positioned within said opening and adapted for having a volume of fluid pass thereover and engage said first surface of said substrate as said volume moves at a second velocity greater than said first velocity;

fluid inlet means operatively connected to said first channel and said weir for supplying said quantity of fluid to said first channel and said volume of fluid to said weir at a predetermined pressure sufficient to cause said quantity and said volume to move at said first and second velocities, respectively; and fluid blocking means located adjacent said first channel and said weir for substantially blocking said quantity of fluid and said volume of fluid and thereby maintain said fluids at established levels within said first portion such that said fluids will engage said first surface of said substrate when moving at said first and second velocities.

2. The device according to claim 1 further including fluid outlet means operatively connected to said first channel and said weir for having said quantity of fluid and said volume of fluid pass therethrough after engaging said first surface of said substrate.

3. The device according to claim 2 wherein said outlet means include at least one aperture within said head member, said aperture being located substantially above the highest level attained by said quantity of fluid and said volume of fluid during said engagement of said first surface of said substrate.

4. The device according to claim 1 wherein said fluid blocking means comprises an elongated bar.

5. The device according to claim 1 wherein said substrate is adapted for passing through said opening within said head member in a first direction, said fluid channel and said weir being of elongated shape and occupying a position substantially perpendicular to said first direction of travel of said substrate.

6. The device according to claim 5 wherein said fluid blocking means comprises an elongated bar, said bar occupying a position substantially parallel to said first direction of travel of said substrate.

7. The device according to claim 1 wherein said fluid inlet means includes a plurality of holes therein, said holes being located within said first channel for having said quantity of fluid pass therethrough.

8. The device according to claim 1 wherein said first portion further includes a second channel therein located substantially adjacent said first channel, said weir being located substantially between said first and second channels, said second channel being located at a third established distance from said substrate when said substrate is positioned within said opening and adapted for having an amount of fluid therein for engaging said first surface of said substrate as said amount moves at a third velocity substantially equal to or greater than said first velocity and less than said second velocity.

9. The device according to claim 8 wherein said fluid inlet means includes a plurality of holes therein, said plurality of holes located within said second channel for having said amount of said fluid pass therethrough.

10. The device according to claim 8 further including fluid outlet means operatively connected to said first and second channels and said weir for having said quantity of fluid, said volume of fluid and said amount of fluid pass therethrough after engaging said first surface of said substrate, said fluid outlet means including at least one drain located within said first portion substantially between said first and second channels, said drain and said fluid blocking means defining at least one orifice adapted for having said quantity, volume and amount of said fluid pass therethrough.

11. The device according to claim 10 wherein said fluid outlet means includes at least one aperture within said head member located substantially above the highest level attained by said quantity of fluid, said volume of fluid and said amount of fluid during said engagement with said first surface of said substrate.

12. The device according to claim 8 wherein said second portion of said head member includes a first channel therein located at a fourth established distance from said substrate when said substrate is positioned within said opening and adapted for having a second quantity of opposite surface of said substrate as said second quantity moves at a fourth velocity substantially the same as said first velocity of said first quantity of fluid, said second portion of said head member further including a weir therein located at a fifth established distance from said substrate when said substrate is positioned within said opening and adapted for having a second volume of fluid pass thereover and engage said second surface of said substrate as said second volume moves at a fifth velocity greater than said fourth velocity, said fluid inlet means operatively connected to said first channel of said second portion and said weir of said second portion for supplying said second quantity of fluid to said first channel of said second portion and said second volume of fluid to said weir of said second portion at a second, predetermined pressure sufficient to cause said second quantity and said second volume to move at said fourth and fifth velocities, respectively.

13. The device according to claim 12 wherein said fluid blocking means is located adjacent said weir of said second portion for blocking said second quantity of fluid and said second volume of fluid to maintain said fluids at established levels within said second portion such that said fluids will engage said second surface of said substrate at said fourth and fifth velocities.

14. The device according to claim 13 wherein said fluid blocking means comprises an elongated bar.

15. The device according to claim 12 further including fluid outlet means operatively connected to said first channel of said first portion and said weir of said first portion and to said first channel of said second portion and said weir of said second portion for having said first and second quantities of fluid and said first and second volumes of fluid pass therethrough after engaging said first and second surfaces of said substrate.

16. The device according to claim 15 wherein said fluid outlet means includes at least one aperture within said head member located substantially above the highest level attained by said first and second quantities of fluid and said first and second volumes of fluid within said head member during said engagement with said first and second surfaces of said substrate.

17. The device according to claim 12 wherein said second portion of said head member further includes a second channel therein located substantially adjacent said first channel, said weir within said second portion being located substantially between said first and second channels within said second portion, said second channel within said second portion being located at a sixth established distance from said substrate when said substrate is positioned within said opening and adapted for having a second amount of fluid therein for engaging said second surface of said substrate as said second amount moves at a sixth velocity substantially equal to or greater than said fourth velocity and less than said fifth velocity.

18. The device according to claim 12 wherein said first channel of said first portion of said head member is positioned substantially adjacent said first surface of said substrate and said first channel of said second portion is positioned substantially adjacent said second surface of said substrate in a substantially offset manner with respect to said first channel.

19. The device according to claim 18 wherein said weir of said first portion is located substantially adjacent said first surface and said weir of said second portion is located substantially adjacent said second surface in a substantially offset manner from said weir of said first portion.

20. The device according to claim 12 wherein said first and second portions of said head member are movable relative to each other.

21. The device according to claim 1 wherein said substrate is adapted for being moved through said head member in a first direction, said head member being movable in a second direction substantially perpendicular to said first direction.

22. The device according to claim 21 further including a pair of rails, said head member being movable in said second direction along said rails.

* * * * *